US010968690B2

(12) United States Patent
Kang

(10) Patent No.: US 10,968,690 B2
(45) Date of Patent: Apr. 6, 2021

(54) SUNSHADE SYSTEM FOR INDOOR BRIGHTNESS AND TEMPERATURE CONTROL

(71) Applicant: Seungho Kang, Barrigada, GU (US)

(72) Inventor: Seungho Kang, Barrigada, GU (US)

( * ) Notice: Subject to any disclaimer, the term of this patent is extended or adjusted under 35 U.S.C. 154(b) by 248 days.

(21) Appl. No.: 16/216,129

(22) Filed: Dec. 11, 2018

(65) Prior Publication Data
US 2020/0181974 A1  Jun. 11, 2020

(51) Int. Cl.
*E06B 9/04* (2006.01)
*A47L 4/00* (2006.01)
*H02S 20/30* (2014.01)
*H02S 20/22* (2014.01)
*E06B 9/24* (2006.01)

(52) U.S. Cl.
CPC ...... *E06B 9/04* (2013.01); *A47L 4/00* (2013.01); *H02S 20/22* (2014.12); *H02S 20/30* (2014.12); *E06B 2009/2476* (2013.01)

(58) Field of Classification Search
CPC ... E05F 11/42; E05F 11/004; E06B 2009/247; E06B 2009/2476
USPC .......................................................... 49/373
See application file for complete search history.

(56) References Cited

U.S. PATENT DOCUMENTS

| 1,393,192 | A | * | 10/1921 | Baker | ...................... | B60J 10/74 |
| | | | | | | 49/211 |
| 2006/0150520 | A1 | * | 7/2006 | Hamazaki | ............. | E05B 47/026 |
| | | | | | | 49/449 |
| 2011/0310458 | A1 | * | 12/2011 | Lee | ......................... | E06B 9/24 |
| | | | | | | 359/270 |
| 2013/0097790 | A1 | * | 4/2013 | Liao | ........................ | B08B 1/008 |
| | | | | | | 15/88.4 |
| 2014/0262056 | A1 | * | 9/2014 | Blair | ......................... | E06B 9/24 |
| | | | | | | 160/5 |
| 2016/0137282 | A1 | * | 5/2016 | Hontz | ....................... | E06B 9/24 |
| | | | | | | 244/129.3 |
| 2017/0342771 | A1 | * | 11/2017 | Piekny | ..................... | H02S 10/40 |
| 2019/0277077 | A1 | * | 9/2019 | Ben-Arie | ................ | E05F 11/40 |
| 2019/0309562 | A1 | * | 10/2019 | Hall | ........................ | E05F 15/71 |
| 2020/0144960 | A1 | * | 5/2020 | Davy | ...................... | H02S 40/38 |

FOREIGN PATENT DOCUMENTS

| JP | 2002-097860 | A | 4/2002 |
| KR | 2003-002950 | A | 1/2003 |
| KR | 10-2011-127401 | A | 11/2011 |
| KR | 10-2016-0069604 | A | 6/2016 |

* cited by examiner

*Primary Examiner* — Gregory J Strimbu
(74) *Attorney, Agent, or Firm* — Fish & Richardson P.C.

(57) ABSTRACT

A sunshade system includes a frame unit including a first frame and a second frame that extends from a side of the first frame, a sunshade unit located at the frame unit and configured to slide relative to the frame unit to cover and uncover a window opening; a power transmission unit located between the first frame and the second frame and configured to drive the sunshade unit, a washing brush configured to be operated by the power transmission unit and to reduce foreign materials on the sunshade unit based on a sliding movement of the sunshade unit; a control unit configured to control the power transmission unit, and a cover that covers the power transmission unit and the washing brush. The control unit includes a sensor configured to monitor a temperature and a brightness level of an indoor area.

17 Claims, 4 Drawing Sheets

SUNSHADE SYSTEM FOR INDOOR BRIGHTNESS AND TEMPERATURE CONTROL

TECHNICAL FIELD

The present disclosure relates to a sunshade system configured to adjust the indoor brightness and temperature and, more specifically, a sunshade system configured to easily to adjust the indoor brightness and temperature and installed on an outer side of a building's window to automatically intercept sunlight transmitted through the window in accordance with desired indoor conditions.

BACKGROUND

Windows may be installed in various forms on outer walls of a building. The window may allow visual communications and transmission of light from an outside to indoor areas through the windows.

In some cases, people may prefer buildings that face southward due to the fact that sunlight is provided in more abundance, and there are instances in which larger windows are installed on the southward side of a building, and through this building sunlight flows indoors, and with this sunlight it is possible to keep the indoor temperature higher.

During the summer time when the temperature rises, the indoor temperature may increase due to the sunlight that flows into the window, so cooling equipment such as air conditioners may be used to decrease the indoor temperature, which may results in an increase of cost.

In some instances, curtains and blinds may be installed to block sunlight that flows through windows. In some cases, these devices may darken the indoor space if light is blocked.

In some examples, the curtains or blinds are manipulated directly by the user.

This application is related to a Korean patent application of the same inventor, Serial No. 10-2016-0148946, filed on Nov. 9, 2016, now Korean Patent No. 10-1869964.

SUMMARY

The present disclosure provides a sunshade system that can keep the indoor temperature and brightness consistent and that can further remove foreign materials on a solar panel surface, thereby further improving solar power energy efficiency.

According to one aspect of the subject matter described in this application, a sunshade system includes: a frame unit configured to be installed at an outer wall of a window, the frame unit comprising a first frame and a second frame that extends from a side of the first frame; a sunshade unit located at the frame unit and configured to slide relative to the frame unit to cover and uncover at least a portion of the window; a power transmission unit located between the first frame and the second frame, the power transmission unit comprising a motor configured to drive the sunshade unit, a drive shaft, and a pair of drive gears coupled to the drive shaft; a washing brush that is configured to operate synchronizing with the power transmission unit and that is configured to reduce foreign materials disposed on a surface of the sunshade unit based on a sliding movement of the sunshade unit relative to the frame unit; a control unit configured to control the power transmission unit, the control unit comprising a sensor that is configured to set a temperature of an indoor area and a brightness level of the indoor area and that is configured to monitor the temperature and the brightness level; and a cover that covers the power transmission unit and the washing brush, the cover defining an opening that allows the sunshade unit to pass based on the sunshade unit sliding relative to the frame unit. The cover comprises a hinge cover located in the opening and configured to open and close at least a portion of the opening.

Implementations according to this aspect may include one or more of the following features. For example, the sunshade unit may include a solar panel, an insulating panel located inward of the solar panel toward the indoor area, an light emission diode (LED) panel located inward of the insulating panel toward the indoor area, and rack gears that are each located at an upper portion of the insulation panel and a lower portion of the insulation panel, the rack gears being configured to engage with the pair of drive gears of the power transmission unit. In some implementations, the washing brush may extend in a vertical direction by a length corresponding to a height of the solar panel in the vertical direction, where one side of the washing brush is connected to the drive shaft of the power transmission unit, and the washing brush is configured to rotate simultaneously with the sliding movement of the sunshade unit.

In some implementations, the cover may accommodate at least a portion of the sunshade unit. In some examples, the washing brush is located between the first frame and the second frame corresponding to a position of the power transmission unit. In some examples, each of the rack gears may extends in a width direction of the insulating panel.

In some implementations, a length of each of the rack gears in the width direction of the insulating panel is greater than or equal to a width of the insulation panel. In some examples, the sunshade unit is configured to slide relative to the frame unit at least one of in a first direction from the first frame to the second frame or in a second direction from the second frame to the first frame. In some examples, the power transmission unit is connected to a lower part of the wash brushing unit at a position corresponding to the lower portion of the insulating panel.

In some implementations, the rack gears includes a first rack gear located at the upper portion of the insulation panel and a second rack gear located at the lower portion of the insulation panel, where the power transmission unit is connected to the second rack gear. In the same or other implementations, the power transmission unit is connected to the first rack gear. In some cases, the power transmission unit is connected to both of the first and second rack gears.

DETAILED DESCRIPTION

Figure 1:
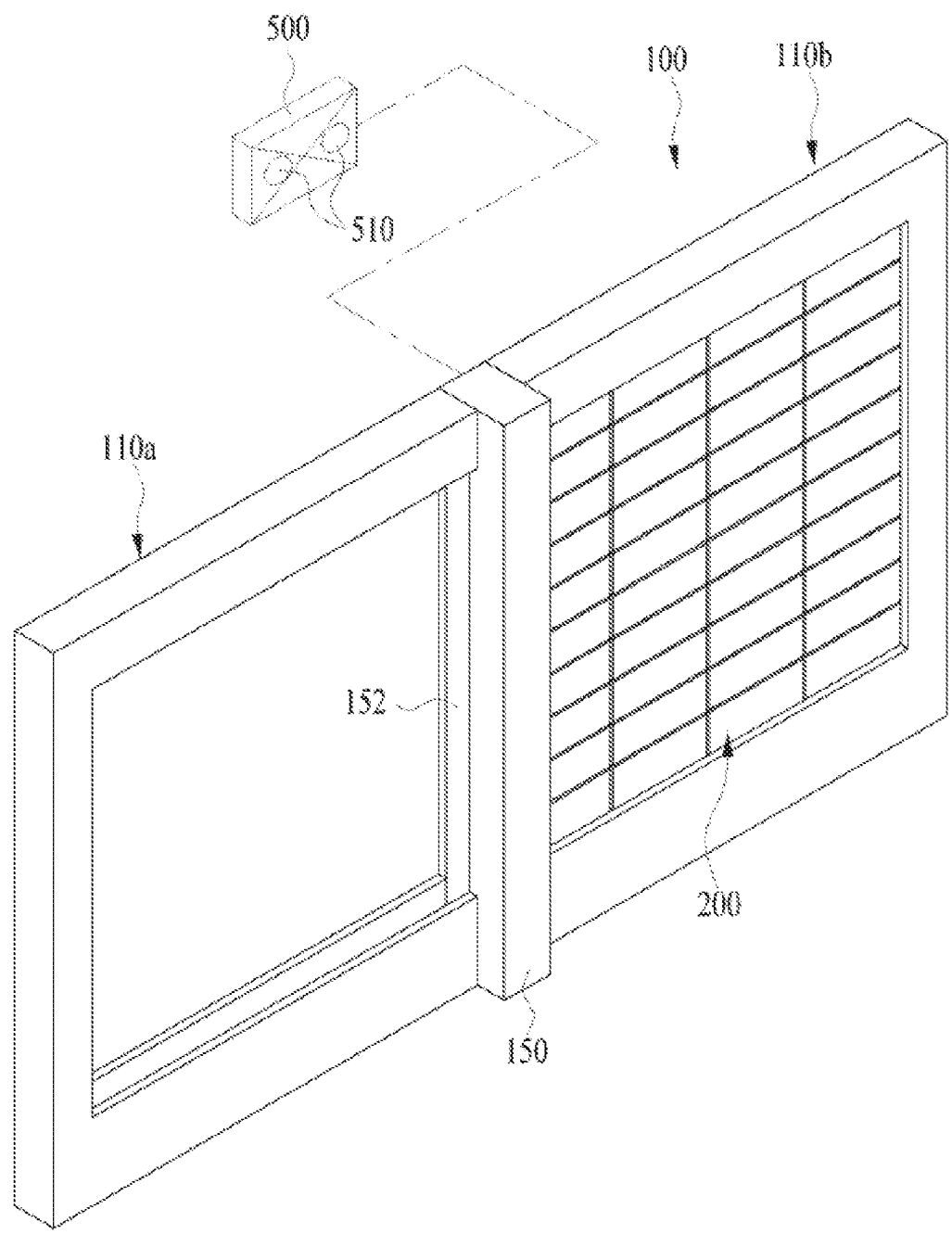
FIG. 1 is a perspective view illustrating an example sunshade system configured to adjust the indoor brightness and temperature.

The present disclosure provides a sunshade system for adjusting the indoor brightness and temperature that is capable of not only automatically intercepting sunlight transmitted inside through the window in accordance with desired indoor conditions but also emit brightness similar to sunlight from the intercepted window's location in order to prevent the indoor space from becoming dark.

Accordingly, the present disclosure provides a sunshade system with which it is easy to adjust the indoor brightness and temperature that includes a frame unit that is installed at the outer wall of a window sill of a building and that may include the first frame and the second frame that extends from one side of the first frame, a sunshade unit that is installed on the frame unit and that is slid to cover or uncover the window, a power transmission unit that is installed between the frame unit's first frame and second frame and equipped with a motor that moves the sunshade unit, a drive shaft, and a pair of drive gears fixed to the drive shaft, a washing brush that is installed in such a way to synchronize with the power transmission unit and that removes foreign materials on the sunshade unit's surface when the sunshade unit moves, and a control unit equipped with a sensor that sets and monitors the indoor temperature and brightness wherein the power transmission unit is automatically controlled by the control unit.

The sunshade may include a solar panel, an insulating panel, and an LED panel layered in sequence from the building's exterior toward the building's indoor and wherein on the top and bottom of the insulation panel is installed a rack gear that combines with the power transmission unit's drive gear.

The sunshade may include a solar panel, an insulating panel, and an LED panel layered in sequence from the building's exterior toward the building's indoor and wherein on the top and bottom of the insulation panel is installed a rack gear that combines with the power transmission unit's drive gear.

The washing brush's length corresponds to the solar panel's width in the vertical direction and wherein one side of the washing brush is connected to the power transmission unit's motor drive axis to rotate simultaneously with the sunshade unit's movement.

The present disclosure configured as described previously is equipped with a power transmission unit that enables the sunshade unit to move automatically and a washing brush that can remove foreign materials on the surface of the sunshade unit, not only providing the convenience of keeping the indoor temperature and brightness consistent but also removing foreign materials on the solar panel's surface, thereby improving solar energy efficiency even further.

Also the sunshade unit is equipped with a solar panel, thereby helping to reduce the consumption of home or commercial electricity.

Below, the present disclosure will be described in detail with drawings of an advisable implementation of the sunshade system with which it is easy to adjust the indoor brightness and temperature under the present disclosure. For reference, the terms and vocabularies used in the statement or the scope of claims section should not be interpreted with the conventional dictionary definitions. Rather, these terms and vocabularies must be interpreted based on the definitions and concepts that conform to the technological philosophy of the present disclosure from the perspective that the inventor is able to define terms and concepts appropriately in order to explain the inventor's disclosure in the best way possible. In some examples, the implementations described in the statement and the configurations illustrated in the drawings are merely most advisable implementations of the present disclosure, and do not represent all technological ideas of the present disclosure, so it must be understood at this point in time of filing the present application that there could be various equivalents and modifications that can replace these.

Figures 4A, 4B:
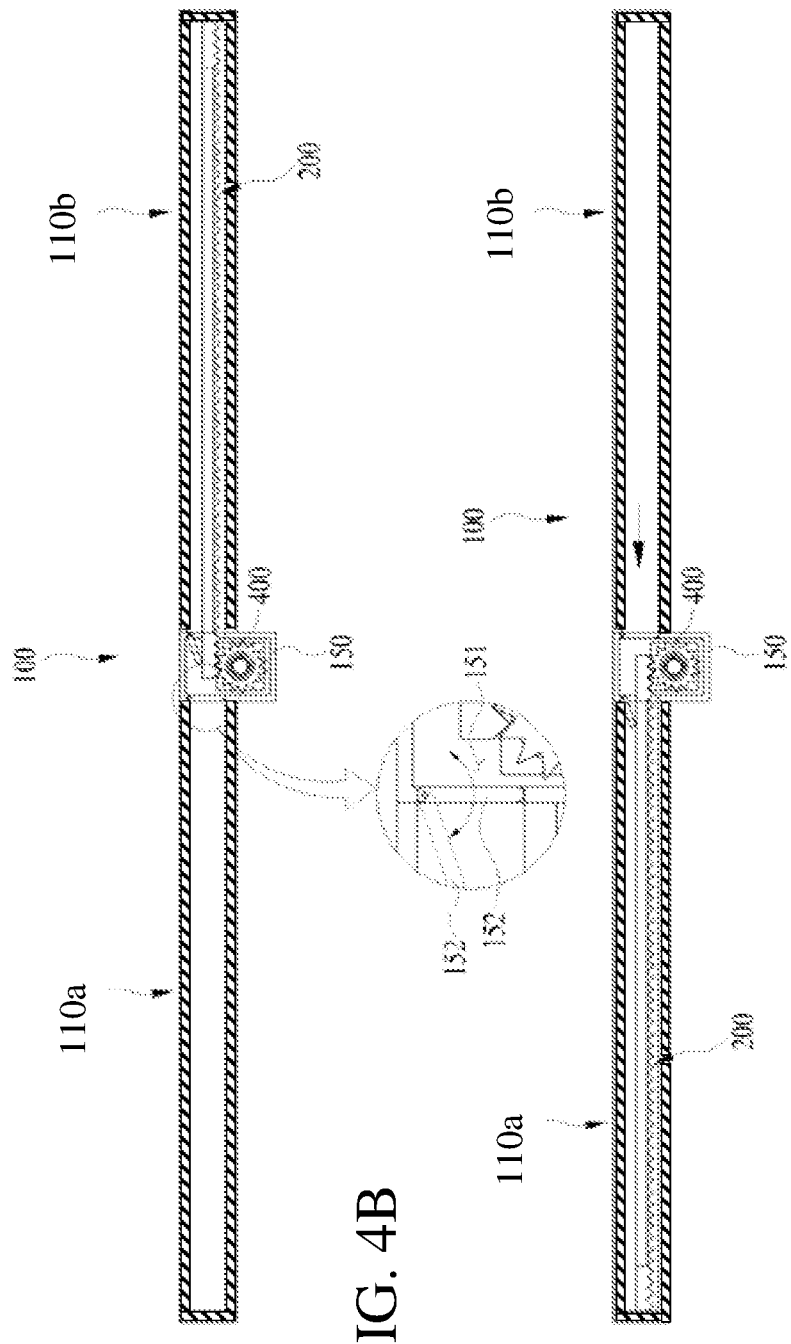
FIGS. 4A and 4B are flat cross-sectional views illustrating an example operation of an example sunshade system configured to adjust the indoor brightness and temperature.

Below, an advisable implementation of the present disclosure will be described in detail by referring to the attached drawings in FIG. 2, FIG. 4A, and FIG. 4B.

As illustrated, the sunshade system according to the present disclosure includes a frame unit 100 that is installed at the outer wall of a window sill of a building and that may include the first frame 110a and the second frame 110b that extends from one side of the first frame 110a, a sunshade unit 200 that is installed on the frame unit and that is slid to cover or uncover the window, a power transmission unit 300 that is installed between the frame unit 100's first frame 110a and second frame 110b and equipped with a motor 310 that moves the sunshade unit 200, a drive shaft 320, and a pair of drive gears 330 fixed to the drive shaft 320, a washing brush 400 that is installed to synchronize with the power transmission unit and that removes foreign materials on the sunshade unit's surface when the sunshade unit moves, and a controller 500 or control unit equipped with a sensor 510 that sets and monitors the indoor temperature and brightness.

First, the frame unit 100 is installed at the outer wall of the window sill of a building, and plays the role of intercepting sunlight coming in through the window.

The frame unit 100 under the present disclosure may include the first frame 110a and the second frame 110b that extends from one side of the first frame 110 so that the sunshade unit 200 can be moved by sliding.

The frame unit 100 may include a rectangular shape including an upper frame and a lower frame that extend horizontally while being separated from each other vertically and two left and right frames that connect both ends of the upper and lower frames.

In some examples, the frame unit 100 is equipped with a cover 150 that wraps the power transmission unit 300 and the washing brush 400.

Namely, the power transmission unit 300 and washing brush 400 are configured to be covered by the cover 150 so that they will not be exposed.

In some examples, in order to obtain sufficient space to ensure stable operation of the power transmission unit 300 and washing brush 400, the cover 150 protrudes more than front and back direction widths of the vertical frame and horizontal frame.

In some examples, an opening 151 is formed on the cover 150 so that the sunshade unit 200 can pass through when moving by sliding, and a hinge cover 152 that controls opening and closing is formed on the opening 151.

The hinge cover 152 is configured to prevent or reduce foreign materials from flowing into the cover 150 through the opening 151, and is configured to be opened by the configuration of the moving sunshade unit 200, and when the interference caused by being contacted with the sunshade unit 200 is removed, the hinge cover reverts to the original closed position by the spring's elasticity.

In some examples, the cover 150's opening 151 is kept closed by the sunshade unit 200 and hinge cover 152.

In some implementations, the sunshade unit 200 may be installed on the frame unit 100, and moves by sliding in order to cover or expose sunlight transmitted through the window in order to maintain pleasant indoor conditions.

The sunshade unit 200 under the present disclosure may include a solar panel 210 connected by multiple unit cells 211 capable of receiving light energy from sunlight and converting light energy to electric energy, an insulation panel that supports the solar panel 210, and an LED panel 230 that is installed on the other side of the insulation panel 220 and that projects the light source through electricity.

Namely, the sunshade unit 200 may include the solar panel 210, the insulation panel 220, and the LED panel 230 layered sequentially from the building's outside to the building's inside.

In some implementations, on the top and bottom of the insulation panel 220, rack gears 240, which are configured to engage with the power transmission unit 300's drive gear 330, may be installed.

The sunshade unit 200 under the present disclosure is configured to produce solar energy internally for automatic sliding movements without using external power (home, industrial, etc.).

Such a sunshade unit 200 described above covers sunlight that goes through the window, thereby preventing the indoor temperature from increasing, and at the same time in the event that the sunlight that passes through the window is intercepted, the LED panel 230 projects light to prevent the indoor area from becoming dark.

Therefore, through the configuration of the sunshade unit 200, both the indoor brightness and the indoor temperature can be maintained at pleasant levels simultaneously.

Figure 2:
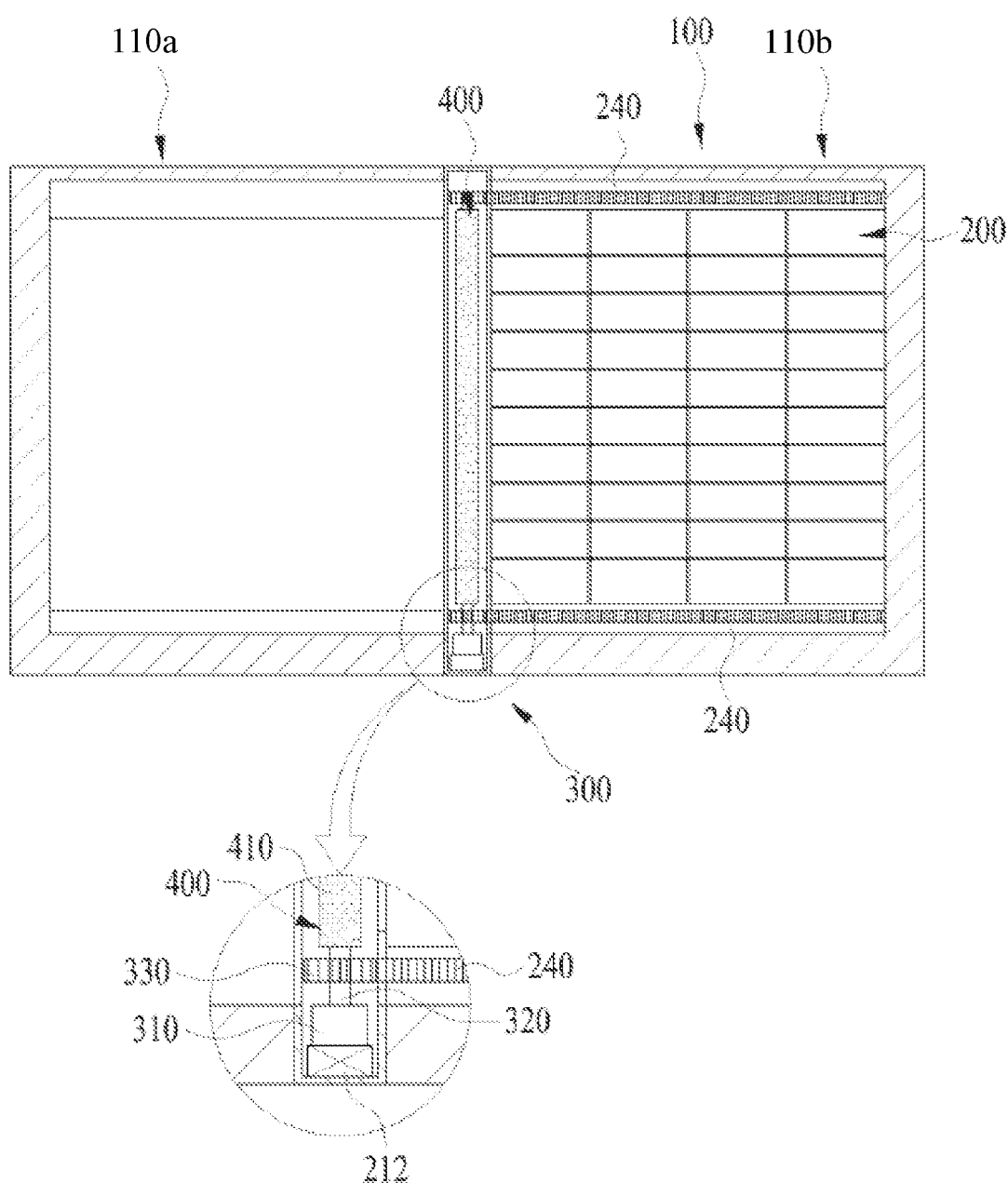
FIG. 2 is a frontal cross-sectional view of FIG. 1.
Figure 3:
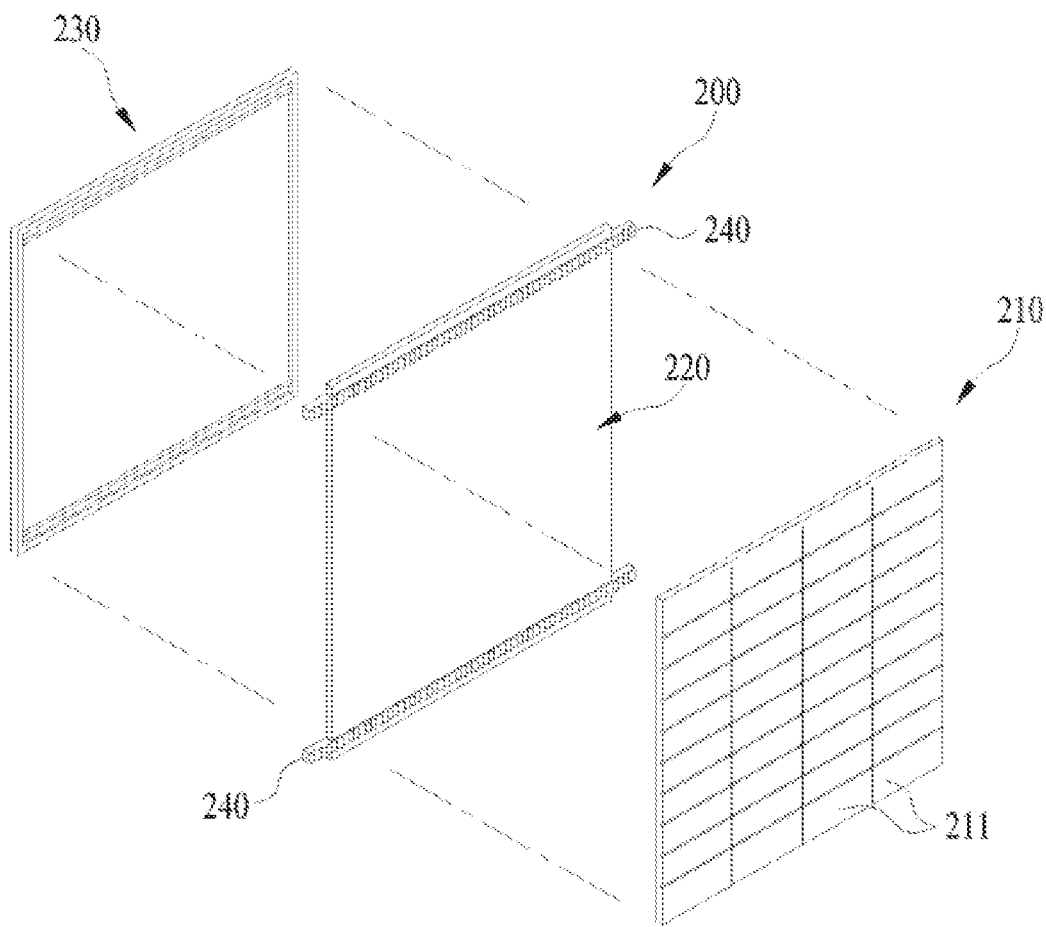
FIG. 3 is an exploded view illustrating an example configuration of the sunshade unit of FIG. 1.

In some examples, the sunshade unit 200 may be installed with a battery 212 to store the electric energy charged through the solar panel 210 (refer to FIG. 2).

On the other hand, the power transmission unit 300 is installed between the first frame 110a and the second frame 110b of the frame unit 100, and plays the role of generating power so that the sunshade unit 200 can move by sliding.

In some implementations, the power transmission unit 300 may include a motor 310, a drive shaft 320 that is connected to the motor 310, and a pair of drive gears 330 that is fixed to the drive shaft 320.

In some implementations, the drive gear 330 may be installed in two locations that correspond to the rack gear 240.

The motor 310 of the power transmission unit 300 configured as described as above can operate when electric current is supplied from the battery 212, and the motor 310's propulsion rotates the drive shaft 320 and the drive gear 330 that is connected to the drive side. At this time, the rack gear 240 that is geared with the drive gear 330 moves the sunshade unit 200 in the direction of one side and in the direction of another side in straight lines.

On the other hand, the washing brush 400 is installed to be configured to synchronize with the power transmission unit 300, and plays the role of removing the foreign materials on the sunshade unit when the sunshade unit 200 moves.

The washing brush 400 may be in the form of a cylinder combined to the motor 310's drive side, and a brush component 410 that may be formed around the outer circumference of the cylinder.

Specifically, the washing brush 400's length corresponds to the vertical width of the solar panel 210, and its one end is connected to the power transmission unit 300's motor drive shaft 320 so that it rotates simultaneously when the sunshade unit moves.

Namely, the washing brush 400 under the present disclosure rotates in a fixed location, and washing of the solar panel 210 occurs when the sunshade unit 200 moves.

In some examples, the brush component 410 can be formed not only in the convention radial shape but also in a helical form structure according to the lengthwise direction of the drive shaft 320. This is to remove foreign materials by letting the foreign materials or dust on the solar panel's surface be naturally pushed to one direction by the helical form brush component 410 when the brush component 410 washes the solar panel 210's surface as the drive shaft rotates.

In some examples, the indoor space where the frame unit 100 is installed includes a controller 500 equipped with a sensor 510 that sets and senses indoor temperature and brightness.

Namely, with the configuration of the controller 500, automatic control takes place so that pleasant indoor environment can be maintained by the sensor 510 in accordance with the temperature and brightness set by the user.

The present disclosure described above is not limited by the implementation described above or by the attached drawings. It is clear to those with ordinary level of knowledge in the technological field in which the present disclosure belongs that it is possible to make various replacements, modifications, and changes within the scope of the present disclosure without deviating from the technological concept of the present disclosure.

What is claimed is:

1. A sunshade system comprising:
   a frame unit that defines a window opening, the frame unit comprising a first frame and a second frame that extends from a side of the first frame;
   a sunshade unit located in the frame unit and configured to slide relative to the frame unit to cover and uncover at least a portion of the window opening;
   a power transmission unit located between the first frame and the second frame, the power transmission unit comprising:
      a drive shaft that extends in a vertical direction from a lower portion of the frame unit to an upper portion of the frame unit,
      a motor configured to rotate the drive shaft,
      an upper drive gear coupled to an upper end of the drive shaft, and
      a lower drive gear coupled to a lower end of the drive shaft;
   a washing brush that extends in the vertical direction, that is configured to be rotated by the drive shaft, and that is configured to reduce foreign materials disposed on a surface of the sunshade unit based on a sliding movement of the sunshade unit relative to the frame unit and the washing brush;
   a control unit configured to control the power transmission unit to control a position of the sunshade unit relative to the window opening to control light passing through the window opening into an indoor area, the control unit comprising a sensor that is configured to measure a temperature and a brightness level of the indoor area; and
   a cover that extends in the vertical direction, that is located between the first frame and the second frame, and that covers the power transmission unit and the washing brush, the cover defining a sunshade unit opening that the sunshade unit passes through as the sunshade unit slides relative to the frame unit,
   wherein the cover comprises a hinge cover configured to open and close at least a portion of the sunshade unit opening.

2. The sunshade system according to claim 1, wherein the sunshade unit comprises:
   a solar panel;
   an insulating panel;
   a light emission diode panel; and a first rack gear on an upper portion of the insulating panel and a second rack gear on a lower portion of the insulating panel, the first and second rack gears being configured to engage with the upper and lower drive gears of the power transmission unit, respectively.

3. The sunshade system according to claim 2, wherein a length of the washing brush in the vertical direction corresponds to a height of the solar panel in the vertical direction,
wherein the washing brush is connected to the drive shaft of the power transmission unit, and
wherein the washing brush is configured to rotate simultaneously with the sliding movement of the sunshade unit.

4. The sunshade system according to claim 2, wherein the sunshade unit is configured to slide relative to the frame unit of in a first direction or in a second direction.

5. The sunshade system according to claim 3, wherein the drive shaft is connected to a lower part of the washing brush at a position corresponding to the lower portion of the insulating panel.

6. The sunshade system according to claim 3,
wherein the power transmission unit is connected to the second rack gear.

7. The sunshade system according to claim 3, wherein the rack gears
wherein the power transmission unit is connected to the first rack gear.

8. The sunshade system according to claim 2, wherein each of the rack gears extends in a width direction of the insulating panel.

9. The sunshade system according to claim 8, wherein a length of each of the rack gears is greater than or equal to a width of the insulating panel.

10. The sunshade system according to claim 1, wherein the cover accommodates at least a portion of the sunshade unit.

11. The sunshade system according to claim 1, wherein the washing brush is located between the first frame and the second frame.

12. The sunshade system according to claim 1, further comprising:
a first rack gear that is disposed adjacent to the upper portion of the frame unit, that extends in a horizontal direction along the upper portion of the frame unit, and that is configured to engage with the upper drive gear; and
a second rack gear that disposed adjacent to the lower portion of the frame unit, that extends in the horizontal direction along the lower portion of the frame unit, and that is configured to engage with the lower drive gear.

13. The sunshade system according to claim 12, wherein the motor is located at a lower part of the cover.

14. The sunshade system according to claim 13, wherein the lower drive gear is located between a lower end of the washing brush and the motor.

15. The sunshade system according to claim 1, wherein the cover space that accommodates the motor, the drive shaft, the upper drive gear, the lower drive gear, and the washing brush.

16. The sunshade system according to claim 15, wherein the hinge cover is disposed adjacent to the washing brush.

17. The sunshade system according to claim 1, wherein the cover extends vertically along the drive shaft to thereby cover the motor, the drive shaft, the upper drive gear, the lower drive gear, and the washing brush.

* * * * *

UNITED STATES PATENT AND TRADEMARK OFFICE
CERTIFICATE OF CORRECTION

Page 1 of 1

PATENT NO. : 10,968,690 B2
APPLICATION NO. : 16/216129
DATED : April 6, 2021
INVENTOR(S) : Seungho Kang It is certified that error appears in the above-identified patent and that said Letters Patent is hereby corrected as shown below:

In the Claims

Column 7, Line 16 (Approx.) In Claim 4, before "in a" delete "of".

Column 7, Line 24-26 In Claim 7, before "wherein the power transmission unit" delete "wherein the rack gears".

Column 8, Line 24 In Claim 15, after "cover" insert -- defines a --.

Signed and Sealed this
First Day of June, 2021

Drew Hirshfeld
*Performing the Functions and Duties of the*
*Under Secretary of Commerce for Intellectual Property and*
*Director of the United States Patent and Trademark Office*